Figure 1:
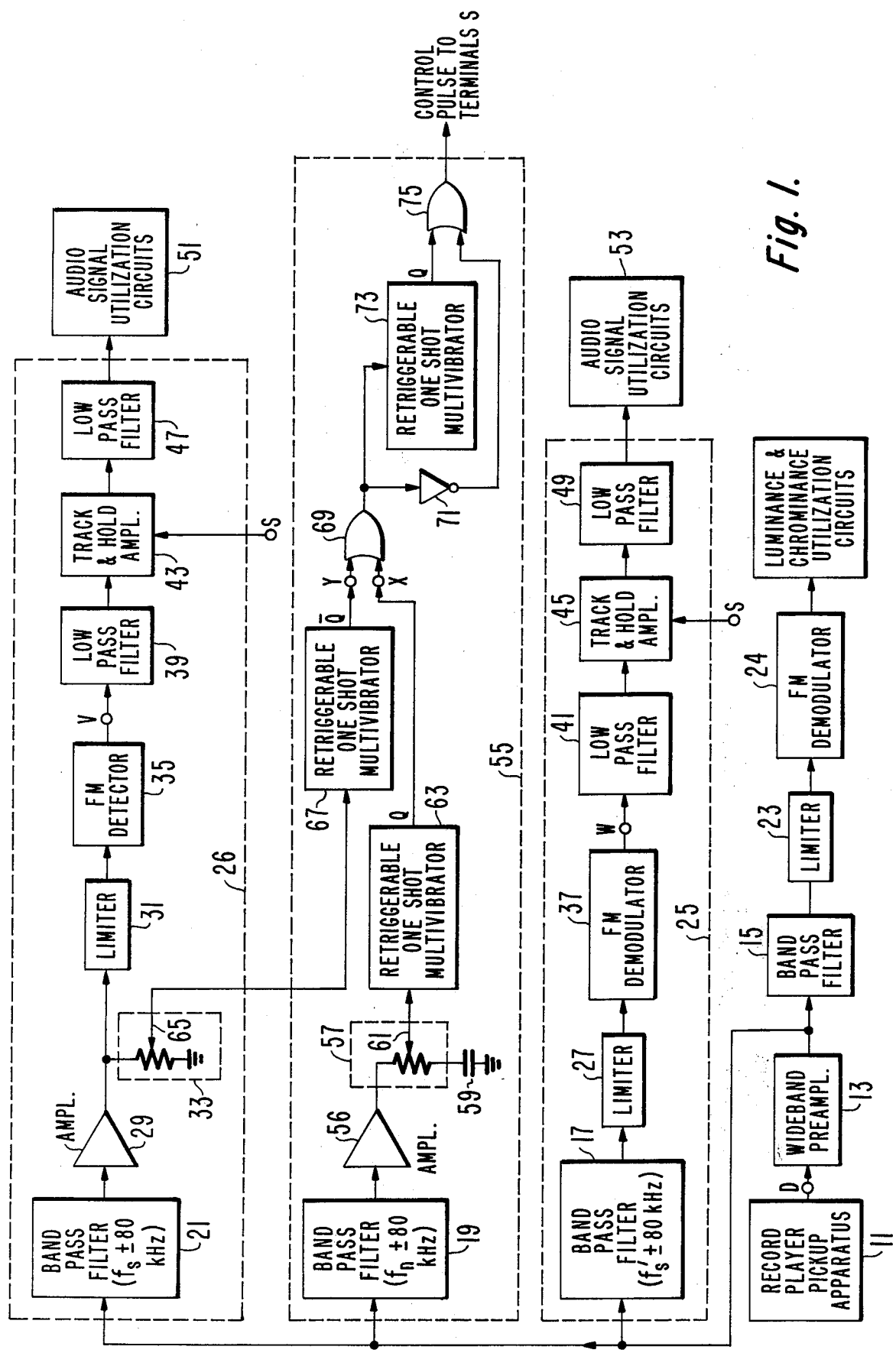

United States Patent [19]
Fox

[11] 4,119,812
[45] Oct. 10, 1978

[54] SIGNAL DEFECT DETECTION AND COMPENSATION WITH SIGNAL DE-EMPHASIS

[75] Inventor: Edward Coley Fox, Cranbury, N.J.

[73] Assignee: RCA Corporation, New York, N.Y.

[21] Appl. No.: 789,294

[22] Filed: Apr. 20, 1977

[51] Int. Cl.² ............................................. H04B 15/00
[52] U.S. Cl. ............................. 179/100.4 D; 179/1 P; 179/100.1 B; 179/100.4 M; 358/128; 360/38
[58] Field of Search ................. G11B/9/06; 358/128, 358/127; 179/100.4 D, 1 P, 100.3 V, 100.1 R, 100.1 VC, 100.1 B, 100.4 M; 360/38

[56] References Cited

U.S. PATENT DOCUMENTS

| | | | |
|---|---|---|---|
| 3,936,619 | 2/1976 | Sugimoto et al. | 179/100.4 D |
| 3,947,636 | 3/1976 | Edgar | 179/100.4 D |
| 4,017,677 | 4/1977 | Baker | 179/100.4 D |
| 4,017,678 | 4/1977 | Baker | 179/100.4 D |
| 4,021,852 | 5/1977 | Hurst | 360/38 |
| 4,038,686 | 7/1977 | Baker | 360/38 |

FOREIGN PATENT DOCUMENTS

| | | | |
|---|---|---|---|
| 741,333 | 11/1955 | United Kingdom | 179/100.4 D |
| 941,704 | 11/1963 | United Kingdom | 179/100.4 D |

Primary Examiner—Raymond F. Cardillo, Jr.
Attorney, Agent, or Firm—Eugene M. Whitacre; William H. Meagher

[57] ABSTRACT

Information processing system, for use with a source of carrier waves modulated with audio information, includes in respective audio channels a demodulator and for recovery of the audio information and track-and-hold amplifiers. Separate circuits are provided for detecting carrier drop-outs and impulse noise occurrences. The output of the detecting circuits is utilized to control the operation of the track-and-hold amplifiers to effect a masking of these occurrences. Signal de-emphasis is accomplished in each channel by means of two separate filters respectively arranged to operate on the input and output signal of the track-and-hold amplifier to minimize noise input to the track-and-hold amplifier.

10 Claims, 2 Drawing Figures

SIGNAL DEFECT DETECTION AND COMPENSATION WITH SIGNAL DE-EMPHASIS

The present invention generally relates to audio signal processing systems, and more particularly relates to defect compensation arrangements for such systems.

In audio systems such as transmission systems, recording and reproducing systems and the like employing carrier waves which are frequency modulated in accordance with audio signals, transient wideband impulse noise of a random nature may be introduced into the carrier. In addition, there may be partial or total failure of carriers (referred to as carrier drop-out), with the result that audio signals, recovered from carriers subject to the aforesaid defects, are correspondingly degraded.

In systems, where carrier signals, modulated in accordance with audio information, are recovered by a transducing element, during playback of an information record, instances of carrier drop-outs and impulse noise may occur due to, for example, imperfections in either of the record medium, the transducing element or the cooperative relationship between the record medium and the transducing element.

For convenience of presentation, the present invention will be described in connection with an illustrative video disc recording and playing system of a type described in U.S. Pat. No. 3,842,194 to Clemens.

In the Clemens patent a system is disclosed in which recorded information appears in the form of geometric variations in the bottom of a spiral groove in the surface of a disc substrate covered by a conductive coating, with a dielectric layer overlying the conductive coating. A playback stylus is supported by a pickup arm mounted in an enclosure which is driven radially with respect to a rotating turntable upon which the record is received. The stylus carries a electrode which cooperates with the disc coatings to form a capacitance which varies, as the disc is rotated, in accordance with the groove bottom geometry variations passing beneath the electrode. Appropriate circuitry coupled to the electrode translates the capacitance variations to electrical signal variations representative of the recorded information.

In a desirable form of the above-described illustrative Clemens system, explained in U.S. Pat. No. 3,911,476 to Keizer, a first carrier frequency modulated in accordance with picture information, appears in the form of successive groove bottom depth alternations between maximum and minimum depths, and is desirably accompanied, for monophonic sound reproduction purposes, by sound information, comprising a second carrier (significantly lower in frequency than said picture information carrier) frequency modulated in accordance with audio signals and appearing in the form of "duty cycle" modulation of the depth alternations.

As explained in more detail in U.S. Pat. No. 3,969,756 to Palmer, et. al., where it may be desired to accompany the picture information with multiple channels of sound information (e.g., a stereo sound accompaniment; a bilingual sound track, etc.), the duty cycle modulation approach outlined above may be adapted to provide the desired multichannel sound accompaniment. With each audio signal to be recorded, modulating the frequency of a respectively different sound carrier over a respectively different low frequency deviation range, the duty cycle of the picture information carrier is varied in accordance with the sum of the respective sound carriers.

Pursuant to an illustrative application of the principles of the present invention to the provision of a pair of sound channels for achievement of stereo sound accompaniment, the sound carrier center frequency choices are 715.909 KHz. and 904.720 KHz., and deviation range selection is ±50 KHz. about each center frequency.

Illustratively, a player for video discs of the above-described type, comprises respective FM demodulators with appropriate input filtering stages for respectively recovering audio and video signals from the carrier signals obtained by the disc player. However, a problem that may occur (unless compensated) in the reproduced sound is the intermittent reproduction at random intervals of disturbances in the form of "tick" and "pop" sounds supplanting the appropriate sound information, and which may be respectively associated with carrier drop-outs and impulse noise defects. While these defects are not destructive of the audio information as a whole, they can be a source of considerable annoyance to the listener.

An analysis of the problem has revealed that a variety of different causes may lead to the production, in the aforementioned video disc player, of different ones of the annoying audio defects. Some of the causes may be associated with defects in the record itself. Other causes may be associated with the conditions encountered in a particular playing of a given disc (e.g., stylus encounters with debris of various forms in various regions of the disc groove). Still other causes (e.g., scratches, dents, etc.) may be associated with the past history of use or abuse of the disc being played. Without further detailing of the causes of the audio defects, it is clear that there are myriad causes of differing types which result in the problem having a high degree of unpredictability, and varying from disc to disc, play to play, groove region to groove region, etc.

In accordance with an illustrative embodiment of the present invention, an audio processing channel is disclosed wherein an audio signal, which is derived by a demodulator from a frequency modulated carrier signal recording subject to playback, is applied to a utilization device through a track-and-hold amplifier operable in either a "track" or a "hold" mode. Separate detection means are provided to detect carrier drop-out and wideband impulse noise respectively. The individual outputs of the detection means serve to trigger respective one shot multivibrators which form part of a circuit for developing a control pulse, in response to the outputs of the detection means, for switching the track-and-hold amplifier between the respective modes. The time duration of the control pulse is selected such that the track-and-hold amplifier is maintained in the hold mode until the defect transient at the input terminal of the track-and-hold amplifier has sufficiently subsided.

In a modification of the aforesaid arrangement, pursuant to another embodiment of the present invention, where other than monophonic sound reproduction is desired, separate audio processing channels similar to the audio processing channel described above may be provided for each respective sound carrier.

Advantageously, in a multi-channel embodiment of the present invention with a common source for the sound carriers (e.g., multiplexed signal) defects in any one carrier are probably reproduced in the other carriers, and a control pulse developed in that one audio processing channel may be employed to control the switching of the respective track-and-hold amplifiers in each of the other audio processing channels. Therefore, the defect detection means and the control pulse developing means need be provided for only one of the audio processing channels.

Pursuant to a further aspect of the invention, lowpass filter circuits are supplied in each of the audio processing channels to provide signal de-emphasis for the high frequency components of the audio signals in a manner complementary to the pre-emphasis thereof and to additionally provide a reduction in noise applied to the track-and-hold amplifier. More specifically, to achieve both of the aforementioned desired results with an economy of elements, the de-emphasis function is implemented by the use of two separate lowpass filters. A first lowpass filter is coupled between the output of the demodulator and the input to the track-and-hold amplifier while a second lowpass filter couples the output of the track-and-hold amplifier with the audio signal utilization circuits. The overall response of the first and second lowpass filters provides the required de-emphasis for the signals processed in the channel and is desirably flat over the bandwidth of the audio signals. Significantly, the first lowpass filter is provided with a bandpass which is narrower than the bandwidth of the output of the demodulator, thus resulting in a reduction in noise transmitted to the input of the track-and-hold amplifier with a concomitant lessened probability of the track-and-hold amplifier holding a noise signal.

Figure 2:
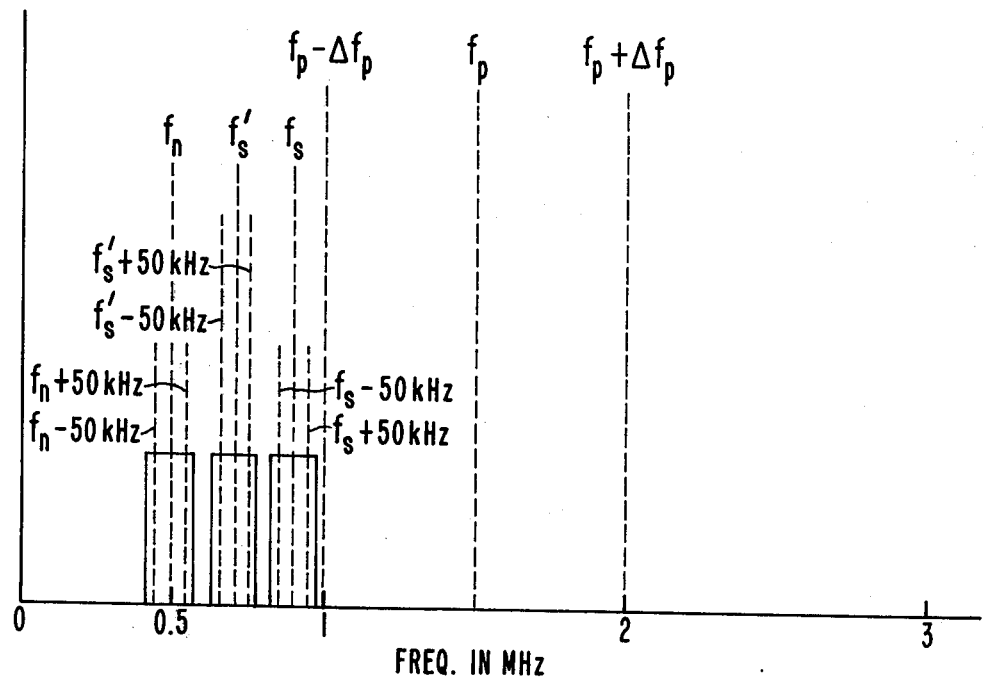

In the accompanying drawings:

FIG. 1 illustrates, partially schematically and partially in block diagram form, video disc player apparatus incorporating a defect compensation system in accordance with an embodiment of the present invention; and FIG. 2 illustrates graphically frequency bands that may be associated with various signal components in the apparatus of FIG. 1.

In the video disc player apparatus of FIG. 1 of the drawing, an input signal for the player's signal processing circuits is developed at terminal D by video disc pickup circuits 11. Illustratively, the video disc pickup system is of the capacitive type previously described, and the structure and circuit arrangement of the video disc pickup apparatus may be generally as described in the aforementioned Palmer, et al. patent. It is assumed that the recording format for the disc to be played is such that the recovered signal information appears at terminal D as an impulse train having a high frequency repetition rate which varies in accordance with the amplitude of a recorded composite color video signal, and having a duty cycle which cyclically varies about a 0.5 value at a plurality of frequencies (significantly lower than the repetition rate of said impulse train) respectively varying in accordance with the amplitude of recorded audio signals.

A wideband pre-amplifier 13 develops an amplified version of the duty cycle modulated impulse train for delivery to the inputs of four bandpass filters, 15, 17, 19 and 21. Bandpass filter 15 has a relatively wide passband encompassing the deviation range of the high frequency picture carrier (fp) as well as the requisite adjacent sideband regions thereof, and selectively passes the picture carrier component of the recorded signal to the relative exclusion of the sound carrier components thereof (the passband of filter 15 illustratively extends from 1.3 MHz to 9.3 MHz). The output of bandpass filter 15 is passed via a limiter 23 (serving to eliminate undesired amplitude variations of the carrier) to demodulator 24.

Illustratively the system of FIG. 1, is shown for a stereophonic sound reproducing system comprising two audio processing channels 25 and 26. It will be apparent to persons skilled in the art that for monophonic sound reproducing systems channel 25 may be eliminated. Conversely, if more than two channels are required, additional channels, similar to channel 25, may be added to the system. Of course in certain applications it may be necessary that a multi-channel sound reproducing system be designed where the drop-out and the impulse noise detection means are duplicated for each individual channel. This, however, as discussed above, was found to be often times an unnecessary duplication of circuits since for most applications wherein sound carriers for multi-channel audio reproduction purposes are utilized, carrier drop-out and impulse noise defect incidents are common to all channels, and therefore only one detection means for each kind of defect is necessary.

Returning to FIG. 1, channels 25 and 26 are respectively shown to comprise bandpass filters 17 and 21 which have relatively narrow passbands correspondingly encompassing the deviation range of the low frequency sound carriers. Bandpass filter 17 is provided with a passband centered about upper sound carrier center frequency $f_s$ of 904.720 KHz., and sufficiently wider than the upper sound carrier's deviation range (e.g., extending $\pm 80$ KHz. about $f_s$) as to ensure passage of all first order and second order sideband components of the modulated upper sound carrier. Bandpass filter 21 is provided with a passband centered about the lower sound carrier center frequency $f_s'$ of 715.909 KHz and sufficiently wider than the lower sound carrier's deviation range (e.g., extending $\pm 80$ KHz about $f_s'$) as to ensure passage of all first order and second order sideband components of the modulated lower sound carrier.

The outputs of bandpass filters 17 and 21 are respectively applied to limiter 27, and, through amplifier 29, to limiter 31 (both limiters 27, 31 serving to eliminate undesired amplitude variations of the respective frequency modulated sound carrier components). The outputs of limiters 31 and 27 are, in turn, respectively applied to frequency modulation demodulators 35 and 37. The reason for amplifying and gain controlling the output signal of bandpass filter 21 is that channel 26 is where carrier drop-outs are to be detected. This point will be made clearer upon a further reading of the specification.

In the audio processing channels 25, 26, demodulators 35 and 37 develop at their respective output terminals V, W signal outputs corresponding to the respectively recorded audio signals. These respective outputs are passed via respective lowpass filters 39, 41 (serving to de-emphasize the audio signal and to reduce source noise in a manner to be subsequently described) to respective track-and-hold amplifiers 43, 45.

Track-and-hold amplifiers 43 and 45 are circuits of the type having a "track" mode and a "hold" mode, wherein when the individual circuit is in its track mode it develops an output that follows (ideally) the input exactly, or is proportional thereto and when the circuit is in its hold mode, it maintains the output constant (ideally) at the value it had at the instant the circuit was commanded by a control pulse to change from its track mode to its hold mode, (the development of the control pulse will be subsequently discussed in detail). The outputs of the respective track-and-hold amplifiers 43, 45 are passed via respective lowpass filters 47, 49 (serving in conjunction with lowpass filters 39, 41 to de-emphasize the audio signals) to respective appropriate audio utilization devices 51, 53 of known types to enable use of the recovered audio signals in the provision of sound.

It may be noted that as the sound carriers $f_s$ and $f_s'$ are processed through the respective demodulators, the signals appearing at the output of the demodulators are subjected to a time delay of the order of a few microseconds. Thus, by the time the detected defects appear at the output of the respective demodulators, the control pulse would have already switched and track-and-hold amplifiers into their hold modes. By exploiting this intrinsic delay in the demodulators no transients are seen in the audio output of the track-and-hold amplifiers.

Thus far, the description of the apparatus of the drawing has been concerned with player operation under normal conditions. It is now in order to consider an altered mode of operation appropriate to the effective compensation or masking of audio defects. Recognition of the onset of a signal defect which calls for alteration of the audio processing channel's operation mode is the function of defect detection circuit 55.

Pursuant to the defect detection principles of the present invention, detection circuit 55 comprises a wideband impulse noise detector which includes a bandpass filter 19 (illustratively provided with a passband centered about a center frequency $f_n$ and extending ±80 KHz about the center frequency) coupled to the signal output of wideband pre-amplifier 13. Bandpass filter 19 has the same bandwidth and ideally is derived from the same lowpass prototype as signal bypass filters 17 and 21 so that the envelope of its impulse response will be identical with that of the filters 17 and 21. Bandpass filter 19 should occupy a region of the spectrum which is relatively free of the modulated carrier components and desirably where no other signal energy exists, illustratively $f_n$ = 500 KHz. Moreover, the center frequency of bandpass filter 19 should be as close as possible to that of the filters 17 and 21, so that the energy of the noise impulses in the bands will be nearly equal. The relationship between the passband of filter 19 and the passbands of filters 17 and 19 is graphically illustrated in FIG. 2.

The output of bandpass filter 19 is amplified in amplifier 56 whose output is coupled to ground potential through a potentiometer 57 in series with a capacitor 59. The wiper arm 61 of potentiometer 57 is coupled to a retriggerable one shot multivibrator (impulse noise one shot) 63 having a cycle time equal to the reciprocal of the lowest frequency which may come out of the impulse noise bandpass filter 19. The output of bandpass filter 19 is amplified and gain controlled so that levels of ringing comparable to standard sound carrier component levels exceeding a predetermined threshold can trigger the impulse noise one shot 63. Therefore, the output of the impulse noise one shot 63 developed at terminal X, will correspond to a logic level "1" whenever the ringing of the impulse noise bandpass filter exceeds the predetermined threshold.

With regard to the carrier dropout detection means, the output of the signal bandpass filter 21 is amplified in amplifier 29 and gain controlled in potentiometer 33, such that the output developed in wiper arm 65 is some preselected fraction of the normal signal level, which preselected fraction will trigger a retriggerable one shot multivibrator (drop-out one shot) 67. Drop-out one shot 67 has a cycle time equal to the reciprocal of the lowest frequency which may come out of the signal bandpass filter 21 due to normal signals. Therefore, the output of the drop-out one shot 67 corresponds to a logic level "0" whenever the carrier bandpass filter output falls below the preselected fraction of the normal signal level and corresponds to a logic level "1" otherwise. Conversely, an inverting output (Q) of the one shot 67, developed at terminal Y corresponds to a logic level "1" whenever the carrier bandpass filter output falls below the preselected fraction of the normal signal level and corresponds to a logic level "1" otherwise.

The output of the impulse noise one shot and the inverted output of the drop-out one shot are respectively applied to two input terminals of a first NOR gate 69 whose output normally corresponds to a logic level "1" when no signals are present at either of terminals X or Y. Whenever the signal present at either of terminal X or Y corresponds to a logic level "1" the output of the NOR gate 69 goes to "zero". The output of the NOR gate 69 is in turn applied to an inverter 71 and to a retriggerable one shot multivibrator (stretch one shot) 73 having a predetermined time duration. The outputs of inverter 71 and stretch one shot 73 are respectively applied to two input terminals of a second NOR gate 75. The inverter 71, stretch one shot 73 and the second NOR gate 75 function as a pulse stretcher to prolong the duration of the pulse developed at the output of the first NOR gate 69 to insure that the transient due to the detected defect at the track-and-hold amplifier input has sufficiently subsided before returning the amplifier to a track mode of operation.

The output of NOR gate 75, applied to respective control inputs S of track-and-hold amplifiers 43, 45 normally corresponds to a logic level "1" which maintains the track-and-hold amplifiers in the track mode. Whenever a defect pulse is detected, the output of NOR gate 75 goes to "zero" and the amplifiers are switched into their hold modes for the duration of the control pulse.

It will now be appropriate to turn to the function of the de-emphasis means employed in the embodiment of the invention illustrated in FIG. 1. The function of the first lowpass filter is to reduce source noise as much as possible while stretching out the transient response to defects as little as possible. Furthermore, the overall response of the first and second lowpass filters should contain the required de-emphasis for the audio processing channel but otherwise be flat over the desired bandwidth.

If the first lowpass filter is too wide band, the control pulse stretch time necessary to mask the defect transients can very short, resulting in minimum loss of audio information. However, the source noise level at the track-and-hold input may be high enough that the track-and-hold amplifier will hold the value of a random noise impulse rather than the last desired signal value. On the other hand, if the first lowpass filter is too narrow band, the holding of random noise impulses is minimized but the control pulse stretch time necessary to mask the defect transients will have to be lengthened resulting in more loss of audio information. Therefore, a compromise must be arrived at between the amount of filtering for noise reduction and the stretch time required to mask the resulting defect transients.

When used with the sound channels of the aforementioned Capacitive Video disc player it was found that a 28 μsec control pulse duration and a 3 pole butterworth 17 KHz low pass pre-hold filter were adequate in providing reduced source noise and defect transient masking.

What is claimed is:

1. An apparatus for use with a source of signals including a carrier signal which is frequency modulated in accordance with a pre-emphasized modulation signal information, said modulated carrier signal being undesirably subject to accompaniment by impulse noise; comprising:

a signal bandpass filter connected to said source of signals for passing said modulated carrier signal;

means responsive to the signal output of said bandpass filter for identifying departures of the amplitude of said signal output from a given amplitude range;

means for developing a first defect indication pulse in response to the output of said departure identifying means;

means responsive to the output of said source of signals for identifying impulse noise;

means for developing a second defect indication pulse in response to the output of said impulse noise identifying means;

means for developing a control pulse in response to the development of either of said first or second defect indication pulses;

frequency modulation detection means responsive to the signal output of said bandpass filter for developing a signal output which corresponds to the modulation signal information;

means responsive to the development of said control pulse for switching between (1) a tracking state wherein the signal appearing at an output terminal thereof is subject to variations responsively to the variations in the signal developed at the output of said first low pass filter and (2) a holding state wherein the signal appearing at the output terminal thereof at the moment of switching is maintained constant for the duration of the holding state;

means responsive to the development of said control pulse for controlling the switching state of said switching means; and first means, coupled between the output of said modulation detection means and an input of said switching means, and second means coupled to the output of said switching means for providing in combination a de-emphasis of the output of said modulation detection means in a manner suitably complementary to the pre-emphasis of the modulation signal information; the passband of said first means being narrower than the bandwidth of the signal developed by said frequency modulation detection means.

2. Apparatus in accordance with claim 1, wherein said impulse noise identifying means comprises:

an impulse noise bandpass filter connected to said pickup apparatus and having substantially the same bandwidth as said signal bandpass filter and being tuned to pass frequencies in a band of frequencies adjacent to the band of frequencies passed by said signal bandpass filter; and means responsive to the output of said impulse noise bandpass filter for identifying departures of the amplitude of the output of said impulse noise bandpass filter from a given amplitude range.

3. Apparatus in accordance with claim 2 wherein said band of frequencies passed by said impulse noise bandpass filter is substantially free of said carrier waves.

4. In a record player, including pickup apparatus for recovering from a record carrier signal subject to frequency modulation in accordance with a pre-emphasized modulation signal information, said modulated carrier waves being undesirably subject to accompaniment by impulse noise; the combination comprising:

a signal bandpass filter connected to said pickup apparatus for passing said modulated carrier signal;

means responsive to the signal output of said bandpass filter for identifying departures of the amplitude of said signal output from a given amplitude range;

means for developing a first defect indication pulse in response to the output of said departure identifying means;

means responsive to the output of said pickup apparatus for identifying impulse noise;

means for developing a second defect indication pulse in response to the output of said impulse noise identifying means;

means for developing a control pulse in response to the development of either of said first or second defect indication pulses;

frequency modulation detection means responsive to the signal output of said bandpass filter for developing a signal output substantially corresponding to the modulation signal information;

signal output means;

means for (1) supplying to said signal output means a signal subject to variations in response to variations in the signal output of said frequency modulation detection means when in a first switching state, and for (2) supplying to said signal output means a constant signal when in a second switching state, said constant signal output corresponding substantially to the signal supplied by said signal supplying means immediately prior to switching from said first switching state of said second switching state;

means responsive to the development of said control pulse for controlling the switching state of said switching means;

a first low pass filter;

means for coupling the output of said frequency modulation detection means through said first low pass filter to an input terminal of said signal supplying means; and a second low pass filter coupled to the output of said signal supplying means; said first and second low pass filters having respective passbands providing in combination a de-emphasis of the modulation signal information in a manner suitably complementary to the pre-emphasis thereof; the passband of said first low pass filter being narrower than the bandwidth of the signal developed by said frequency modulation detection means.

5. Apparatus in accordance with claim 4, wherein said impulse noise identifying means comprises:

an impulse noise bandpass filter connected to said pickup apparatus and having substantially the same bandwidth as said signal bandpass filter and being tuned to pass frequencies in a band of frequencies adjacent to the band of frequencies passed by said signal bandpass filter; and means responsive to the output of said impulse noise bandpass filter for identifying departures of the amplitude of the output of said impulse noise bandpass filter from a given amplitude range.

6. Apparatus in accordance with claim 5, wherein said band of frequencies passed by said impulse noise bandpass filter is substantially free of said carrier waves.

7. In a record player, including pickup apparatus for recovering from a record carrier signal subject to modulation in accordance with a pre-emphasized modulation signal information, the combination comprising:

a signal bandpass filter connected to said pickup apparatus for passing said modulated carrier signal;

means responsive to the signal output of said bandpass filter for identifying departures of the amplitude of said signal output from a given amplitude range;

means for developing a defect indication pulse in response to the output of said departure identifying means;

means for developing a control pulse in response to the development of said defect indication pulse;

modulation detection means responsive to the signal output of said bandpass filter for developing a signal output substantially corresponding to the modulation signal information;

signal output means;

means for (1) supplying to said signal output means a signal subject to variations in response to variations in the signal output of said frequency modulation detection means when in a first switching state, and for (2) supplying to said signal output means a constant signal when in a second switching state, said constant signal output corresponding substantially to the signal supplied by said signal supplying means immediately prior to switching from said first switching state of said second switching state;

means responsive to the development of said control pulse for controlling the switching state of said switching means;

a first low pass filter;

means for coupling the output of said frequency modulation detection means through said first lowpass filter to an input terminal of said signal supplying means; and a second lowpass filter coupled to the output of said signal supplying means; said first and second lowpass filters having respective passbands providing in combination a de-emphasis of the modulation signal information in a manner suitably complementary to the pre-emphasis thereof; the passband of said first lowpass filter being narrower than the bandwidth of the signal developed by said frequency modulation detection means.

8. In a record player, including pickup apparatus for recovering from a record carrier signal subject to frequency modulation in accordance with a pre-emphasized modulation signal information, said modulated carrier waves being undesirably subject to accompaniment by impulse noise; the combination comprising:

a signal bandpass filter connected to said pickup apparatus for passing said modulated carrier signal;

means responsive to the output of said pickup apparatus for identifying impulse noise;

means for developing a defect indication pulse in response to the output of said impulse noise identifying means;

means for developing a control pulse in response to the development of said defect indication pulse;

frequency modulation detection means responsive to the signal output of said bandpass filter for developing a signal output substantially corresponding to the modulation signal information;

signal output means;

means for (1) supplying to said signal output means a signal subject to variations in response to variations in the signal output of said frequency modulation detection means when in a first switching state, and for (2) supplying to said signal output means a constant signal when in a second switching state, said constant signal output corresponding substantially to the signal supplied by said signal supplying means immediately prior to switching from said first switching state of said second switching state;

means responsive to the development of said control pulse for controlling the switching state of said switching means;

a first low pass filter;

means for coupling the output of said frequency modulation detection means through said first lowpass filter to an input terminal of said signal supplying means; and a second lowpass filter coupled to the output of said signal supplying means; siad first and second lowpass filters having respective passbands providing in combination a de-emphasis of the modulation signal information in a manner suitably complementary to the pre-emphasis thereof; the passband of said first lowpass filter being narrower than the bandwidth of the signal developed by said frequency modulation detection means.

9. Apparatus in accordance with claim 8, wherein said impulse noise identifying means comprises:

an impulse noise bandpass filter connected to said pickup apparatus and having substantially the same bandwidth as said signal bandpass filter and being tuned to pass frequencies in a band of frequencies adjacent to the band of frequencies passed by said signal bandpass filter; and means responsive to the output of said impulse noise bandpass filter for identifying departures of the amplitude of the output of said impulse noise bandpass filter from a given amplitude range.

10. Apparatus in accordance with claim 9 wherein said band of frequencies passed by said impulse noise bandpass filter is substantially free of said carrier waves.

* * * * *